US008092760B2

(12) United States Patent
Kim et al.

(10) Patent No.: US 8,092,760 B2
(45) Date of Patent: Jan. 10, 2012

(54) SCANNING ARM FOR SEMICONDUCTOR WAFER POLLUTANT MEASUREMENT APPARATUS AND SCANNING DEVICE USING THE SAME

(75) Inventors: Ho Jin Kim, Icheon-si (KR); Hyoung Bae Kim, Seongnam-si (KR)

(73) Assignee: Korea Techno Co., Ltd, Gyeonggi-Do, Gwangju-Si (KR)

( * ) Notice: Subject to any disclaimer, the term of this patent is extended or adjusted under 35 U.S.C. 154(b) by 747 days.

(21) Appl. No.: 12/206,128

(22) Filed: Sep. 8, 2008

(65) Prior Publication Data

US 2009/0249896 A1    Oct. 8, 2009

(30) Foreign Application Priority Data

Apr. 3, 2008    (KR) .................. 10-2008-0031129

(51) Int. Cl.
*B08B 3/04*    (2006.01)
(52) U.S. Cl. ............. 422/502; 134/1.3; 134/10; 134/13; 134/32; 134/34; 134/902; 438/906

(58) Field of Classification Search .................. None
See application file for complete search history.

(56) References Cited

U.S. PATENT DOCUMENTS

| | | | |
|---|---|---|---|
| 6,960,265 B2 | 11/2005 | Heo et al. | |
| 7,165,331 B1* | 1/2007 | Lindsey et al. | 33/18.1 |
| 2004/0131783 A1 | 7/2004 | Lee | |
| 2004/0163670 A1* | 8/2004 | Ko et al. | 134/2 |
| 2006/0179670 A1* | 8/2006 | Phipps et al. | 33/18.1 |
| 2008/0019878 A1* | 1/2008 | Trump | 422/100 |

* cited by examiner

*Primary Examiner* — P. Kathryn Wright
(74) *Attorney, Agent, or Firm* — Lexyoume IP Group

(57) ABSTRACT

Provided is a scanning arm which moves to collect pollutants on the surface of a semiconductor wafer, for use in a semiconductor wafer pollutant measurement apparatus, and a scanning device using the same. The scanning arm includes: an X-axis portion; a Z-axis portion which is perpendicularly installed with the X-axis portion so as to move forward and backward along the X-axis portion; and a Y-axis portion which is perpendicularly installed with the Z-axis portion so as to move up and down with respect to the Z-axis portion.

1 Claim, 14 Drawing Sheets

SCANNING ARM FOR SEMICONDUCTOR WAFER POLLUTANT MEASUREMENT APPARATUS AND SCANNING DEVICE USING THE SAME

CROSS-REFERENCE TO RELATED APPLICATION

This application claims the benefit of Korean Patent Application No. 10-2008-0031129, filed on 04 Month 03 Day, 2008, in the Korean Intellectual Property Office, the disclosure of which is incorporated herein by reference.

BACKGROUND OF THE INVENTION

1. Field of the Invention

The present invention relates to a semiconductor wafer pollutant measurement apparatus which is called an auto scanning system, and more particularly to, a scanning arm which moves to collect pollutants on the surface of a semiconductor wafer, for use in a semiconductor wafer pollutant measurement apparatus, and a scanning device using the same, which includes a nozzle for discharging and inhaling a reagent solution in the case that the surface of the semiconductor wafer is scanned using the reagent solution and a moving unit having the nozzle.

2. Description of the Related Art

In general, as a semiconductor device is high-integrated, various kinds of pollutants that are produced in semiconductor manufacturing lines and semiconductor manufacturing processes are adsorbed on the surfaces of wafers. As a result, various kinds of pollutants that are adsorbed on the surfaces of wafers affect performance and yield of semiconductor devices.

Accordingly, an analysis of pollutants having sticked on the wafer surface has become important in manufacturing semiconductor devices. In the case of a conventional pollutant analysis method, a predetermined wafer is selected between the respective semiconductor manufacturing lines or the respective semiconductor manufacturing processes, and the surface of the selected wafer is scanned, to thus collect a sample of pollutants for analyzing the pollutants having sticked on the wafer surface, and analyze the collected pollutants sample using a destructive analysis method such as an atomic absorption spectroscopy and an inductively coupled plasma (ICP)-mass spectroscopy, and a nondestructive analysis method such as a total X-ray fluorescent analyzer.

That is, according to the conventional art, after the predetermined wafer has been selected between the respective semiconductor manufacturing lines or the respective semiconductor manufacturing processes, an oxide film that has been coated on the wafer surface should be removed before pollutants having sticked on the wafer surface are collected, in order to collect the pollutants accurately. This has been realized by a vapor phase decomposition (VPD) device.

The VPD device includes a process chamber in which a process proceeds, a loading plate which is positioned in the chamber and on which a wafer is loaded, and a container containing a hydrofluoric acid (HF) which decomposes an oxide film that is coated on the wafer surface. If a wafer is transferred on the loading plate which is installed in the process chamber, the wafer is safely placed in the process chamber for a given time. As a result, the oxide film that has been coated on the wafer surface is completely decomposed by vapor of the hydrofluoric acid (HF) which has been naturally evaporated from the hydrofluoric acid (HF) container.

Thereafter, a user takes out the wafer from the process chamber, and then drops a scan solution on the wafer surface. The user scans the wafer surface directly manually, with the scan solution, to thereby collect a sample of pollutants for pollution analysis of analyzing the pollutants having sticked on the wafer surface. Of course, the collected sample is analyzed to thereby measure a pollution level.

The Korean Patent Registration No. 10-0383264 entitled "Apparatus and method for collecting metallic impurity on a semiconductor wafer" corresponding to U.S. Patent Application Publication No. US 2002/0134406 A1 is already known as the semiconductor wafer pollutant measurement apparatus. The semiconductor wafer metallic impurity collecting apparatus generally includes a process chamber, a transfer unit, a loader unit, a vapor phase decomposition unit, a scanning device, a drying unit, an unloader unit, and a center control unit that controls the semiconductor wafer metallic impurity collecting apparatus on the whole.

Here, the transfer unit, the loader unit, the vapor phase decomposition unit, the scanning device, the drying unit, and the unloader unit among the components of the semiconductor wafer metallic impurity collecting apparatus are implemented in the process chamber. In this case, the transfer unit, the loader unit, the vapor phase decomposition unit, the scanning device, the drying unit, and the unloader unit are placed in a semi-circular form where the transfer unit is placed at the center of the semi-circular form, and the loader unit and the unloader unit are placed at the start portion and the end portion of the semi-circular form, respectively. Here, the vapor phase decomposition unit, the scanning device, and the drying unit are sequentially installed between the loader unit and the unloader unit.

Among the accompanying drawings, FIG. 1 is a partially cutoff perspective view schematically showing the whole structure of a conventional semiconductor wafer pollutant measurement apparatus.

As illustrated in FIG. 1, if a predetermined wafer is selected to analyze a pollution level of the selected wafer at a semiconductor manufacturing line or process, a user transfers the selected wafer to a loader unit which is positioned in the process chamber of the semiconductor wafer pollutant measurement apparatus.

Thereafter, if the user tightly closes the process chamber and then makes the semiconductor wafer pollutant measurement apparatus operate, the transfer unit transfers the wafer located in the loader unit to the loading plate in the vapor phase decomposition (VPD) unit. Then, the vapor phase decomposition (VPD) unit tightly seals the wafer transferred to the loading plate and then decomposes an oxide film coated on the wafer surface using vapor of the hydrofluoric acid (HF).

Then, if the oxide film coated on the wafer surface has been completely decomposed, the transfer unit transfers the wafer located in the vapor phase decomposition (VPD) unit again to an align unit in the scanning device.

Thereafter, the wafer align unit aligns position of the position of the transferred wafer accurately using an align hand, and simultaneously the scanning device is rotated into the position of a nozzle tray. Accordingly, the nozzle provided in the nozzle tray is inserted into the scanning device. Then, the scanning device inhales a predetermined amount of a scan solution from a scan solution bottle which is installed at the center of the nozzle tray, and then moves to the upper portion of the wafer, to thereafter approach the center of the wafer slowly.

Then, the scanning device stops the approach when the center of the wafer substantially contacts the nozzle inserted into the scanning device. If the approach of the scanning device to the center of the wafer stops, a pump discharges part of the scan solution inhaled by the nozzle via a pumping fluid path of the scanning device to the surface of the wafer, and makes the scan solution cohered in a droplet form between the lower portion of the nozzle and the wafer surface.

Thereafter, if the scan solution is cohered in a droplet form in the lower portion of the nozzle that has been inserted into the scanning device and contacts the wafer surface, the wafer align unit makes the wafer rotate in one direction slowly, and the scanning device makes the lower portion of the nozzle, that is, a portion where the scan solution contacts the wafer surface move slowly in one direction. Here, as the pollutants on the wafer surface contacts the externally exposed scan solution, they are of course absorbed into the scan solution.

Here, when the scanning device moves once, a wafer takes a turn, and when the scanning device moves once again, the wafer takes a turn again. That is, the wafer is scanned in a step-by-step style. As described above, if the scan solution is not seceded from the lower portion of the nozzle but scanning of a wafer is ended, the wafer align unit stops rotation and the scanning device stops movement. In this case, a pump inhales all the scan solution which has been used for scanning the wafer into the nozzle using the pumping fluid path.

Thereafter, the scanning device operates by two methods according to user's selection.

On one hand, in the case that a user wishes to analyze a wafer using an atomic absorption spectroscopy, the scanning device rotates to move toward a sampling cup tray so that all the pollutant samples which have been used for scanning the wafer are discharged into a sampling cup. If the pollutant samples which have been used for scanning the wafer have been completely discharged into the sampling cup, the scanning device rotates again so that the nozzle is positioned at the upper portion of the nozzle bottle. Then, the nozzle which has been inserted into the scanning device is seceded from the scanning device using a nozzle secession unit which is installed in the scanning device, so as to be distant from the nozzle bottle.

Thereafter, the wafer is transferred to the unloader unit by the transfer unit, and simultaneously unloaded to the outside. As a result, the pollutants collection process is ended.

On the other hand, in the case that a user wishes to analyze a wafer by a total reflection fluorescence X-ray analysis, the scanning device discharges the pollutant samples which have been used for scanning the wafer to the center of the wafer surface slowly again, and rotates again to make the nozzle positioned at the upper portion of the nozzle bottle. Then, the nozzle which has been inserted into the scanning device is seceded from the scanning device using a nozzle secession unit which is installed in the scanning device, so as to be distant from the nozzle bottle. Then, the wafer is transferred to a heating plate in a drying unit, and then dried, to then be transferred to the unloader unit. As a result, the pollutants collection process is ended.

The scanning device for the wafer transfer unit in the semiconductor wafer pollutant measurement apparatus has an L-shaped robot arm form in which it is possible for the scanning device to move up and down and to rotate left and right. In addition, a rotational shaft which makes the scanning device rotate is provided in the scanning device and a nozzle inserting portion is formed at one end of the scanning device so that a nozzle which coheres a scan solution to scan the wafer surface can be selectively inserted into and taken out from the scanning device.

As described above, the scanning device for the wafer transfer unit in the conventional semiconductor wafer pollutant measurement apparatus moves up and down and rotates left and right at a rotational shaft, simultaneously. Accordingly, the scanning device is complicated due to a structure concentrated into the rotational shaft. Moreover, in the case that the scanning device makes a rotating trace during scanning, to then select the nozzle, the scanning device moves up and down. As a result, there is a shortcoming that an accuracy drops in a motion on the wafer surface that is an important variable at the time of scanning.

Further, in the case that there is no lighting unit in a semiconductor wafer pollutant measurement apparatus, there is no way to identify an accuracy of movement of the scanning device via an outer controller transparent window. Even in the case that there is a lighting unit in a semiconductor wafer pollutant measurement apparatus, a closely positioned lighting unit is needed in order to maintain an accuracy of a contact condition in a nozzle and a scan solution bottle.

SUMMARY OF THE INVENTION

To overcome inconveniences of the conventional art, it is an object of the present invention to provide a scanning arm whose rotation and movement is not concentrated onto a rotational shaft.

It is another object of the present invention to provide a scanning device having a three-axis position determination structure in which a scanning arm straight-linearly moves in a scanning device structure.

It is still another object of the present invention to provide a scanning device in which a nozzle for scanning a reagent solution is combined in the scanning arm.

It is yet another object of the present invention to provide a scanning device in which the surface of a wafer is dried at the same time of scanning the wafer surface.

It is yet still another object of the present invention to provide a scanning device for a semiconductor wafer pollutant measurement apparatus whose scanning accuracy is improved at the time of scanning the wafer surface by improving complexity of the structure of the scanning device.

It is a further object of the present invention to provide a scanning device for a semiconductor wafer pollutant measurement apparatus in which inhalation and discharge of a nozzle is controlled by a syringe pump.

To accomplish the above object of the present invention, according to an aspect of the present invention, there is provided a scanning arm for a semiconductor wafer pollutant measurement apparatus, the scanning arm comprising:

an X-axis portion;

a Z-axis portion which is perpendicularly installed with the X-axis portion so as to move forward and backward along the X-axis portion; and a Y-axis portion which is perpendicularly installed with the Z-axis portion so as to move up and down with respect to the Z-axis portion.

Preferably but not necessarily, the X-axis portion, the Y-axis portion and the Z-axis portion in the scanning arm for the semiconductor wafer pollutant measurement apparatus comprises a linear motion (LM) guide and a screw bar in an external casing, respectively, in which a slider is combined with the screw bar by a ball bushing combination so that the slider moves according to rotation of the screw bar.

According to another aspect of the present invention, there is provided a scanning device for a semiconductor wafer pollutant measurement apparatus, the scanning device comprising:

a scanning arm comprising an X-axis portion, a Z-axis portion which is perpendicularly installed with the X-axis portion so as to move forward and backward along the X-axis portion, and a Y-axis portion which is perpendicularly installed with the Z-axis portion so as to move up and down with respect to the Z-axis portion; and a scanning nozzle which is installed at the Y-axis portion, and inhales a scan solution from a reagent solution bottle to then discharge a reagent scan solution on the surface of a wafer which is located on a scan stage and simultaneously keep an inhalation condition and move along the surface of the wafer, to then inhale and keep the scan solution including pollutants sticked on the wafer surface, and to thereafter move to an analyzer after inhalation to thereby discharge the scan solution.

Preferably but not necessarily, the scanning nozzle of the scanning device for the semiconductor wafer pollutant measurement apparatus comprises: a nozzle main body; a support which supports the nozzle main body; and a pump connector to which a predetermined pumping power is transferred.

Preferably but not necessarily, the support of the scanning device for the semiconductor wafer pollutant measurement apparatus comprises: a second connector which is connected with an inner slider of the Y-axis portion; a first connector which is perpendicularly connected with the second connector; and a mount portion which is horizontally extended from the first connector and on which the nozzle is inserted and mounted.

Preferably but not necessarily, the scanning device for the semiconductor wafer pollutant measurement apparatus further comprises: a bracket including a first connection bracket that is horizontally fixed to the Y-axis portion, a second connection bracket which is installed perpendicularly with respect to the first connection bracket, and a main bracket which is installed horizontally with respect to the second connection bracket in which a lamp main body is inserted and mounted; and a drier including the lamp main body having a built-in halogen lamp, a diffusion plate which diffuses downstream light of the lamp main body, and a socket which makes the lamp main body and the diffusion plate mounted in an inner space of the socket.

Preferably but not necessarily, the scanning device for the semiconductor wafer pollutant measurement apparatus further comprises: a syringe pumping portion having a syringe pump body whose load moves up and down according to ascending and descending operations in an inner cylinder to thereby apply a pressure and inhale and discharge the reagent solution via selection of inhalation and discharge hoses which are connected with an upper valve, respectively.

BRIEF DESCRIPTION OF THE DRAWINGS

The above and/or other aspects of the present invention will become apparent and more readily appreciated from the following description of the exemplary embodiments, taken in conjunction with the accompanying drawings in which.

DETAILED DESCRIPTION OF THE INVENTION

Figure 1:
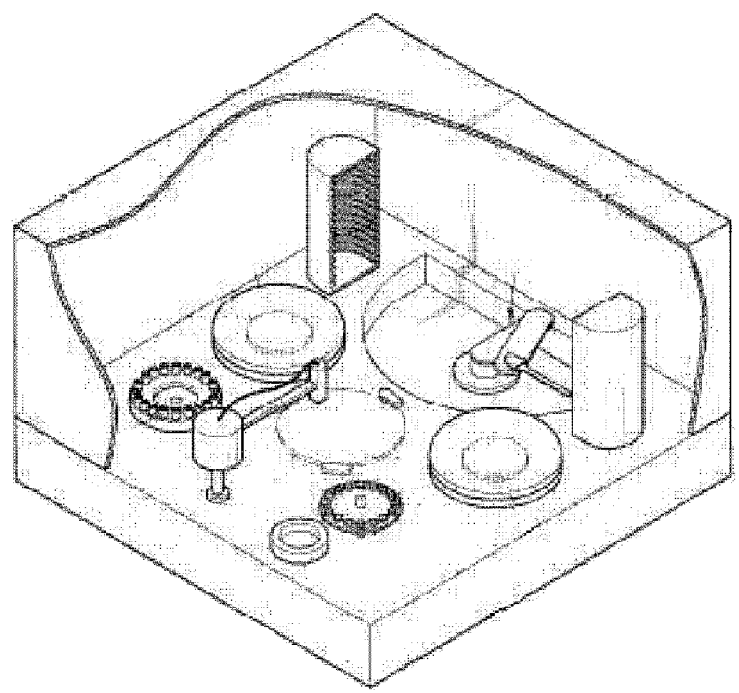
FIG. 1 is a cutoff perspective view showing the whole inside of a conventional semiconductor wafer pollutant measurement apparatus.

Hereinbelow, a scanning arm which moves to collect pollutants on the surface of a semiconductor wafer, for use in a semiconductor wafer pollutant measurement apparatus which is called an auto scanning system, and a scanning device using the same, according to the present invention will be described with reference to the accompanying drawings. Like reference numerals are assigned for like elements in the drawings.

Figure 2A:
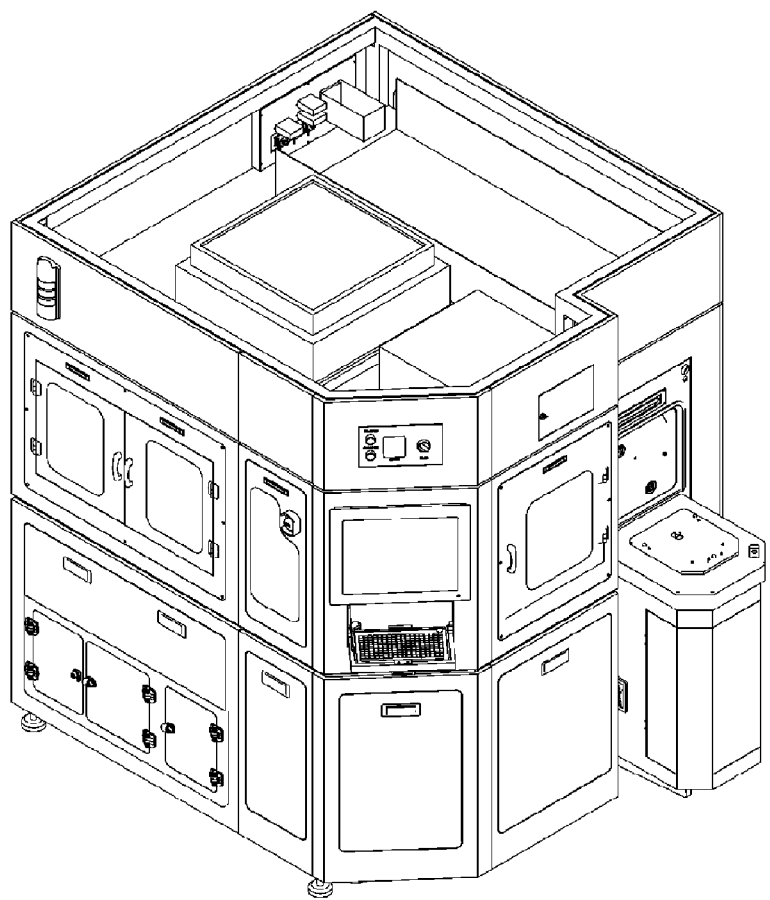
FIG. 2A is a perspective view showing the whole external appearance of a semiconductor wafer pollutant measurement apparatus according to the present invention.
Figure 2B:
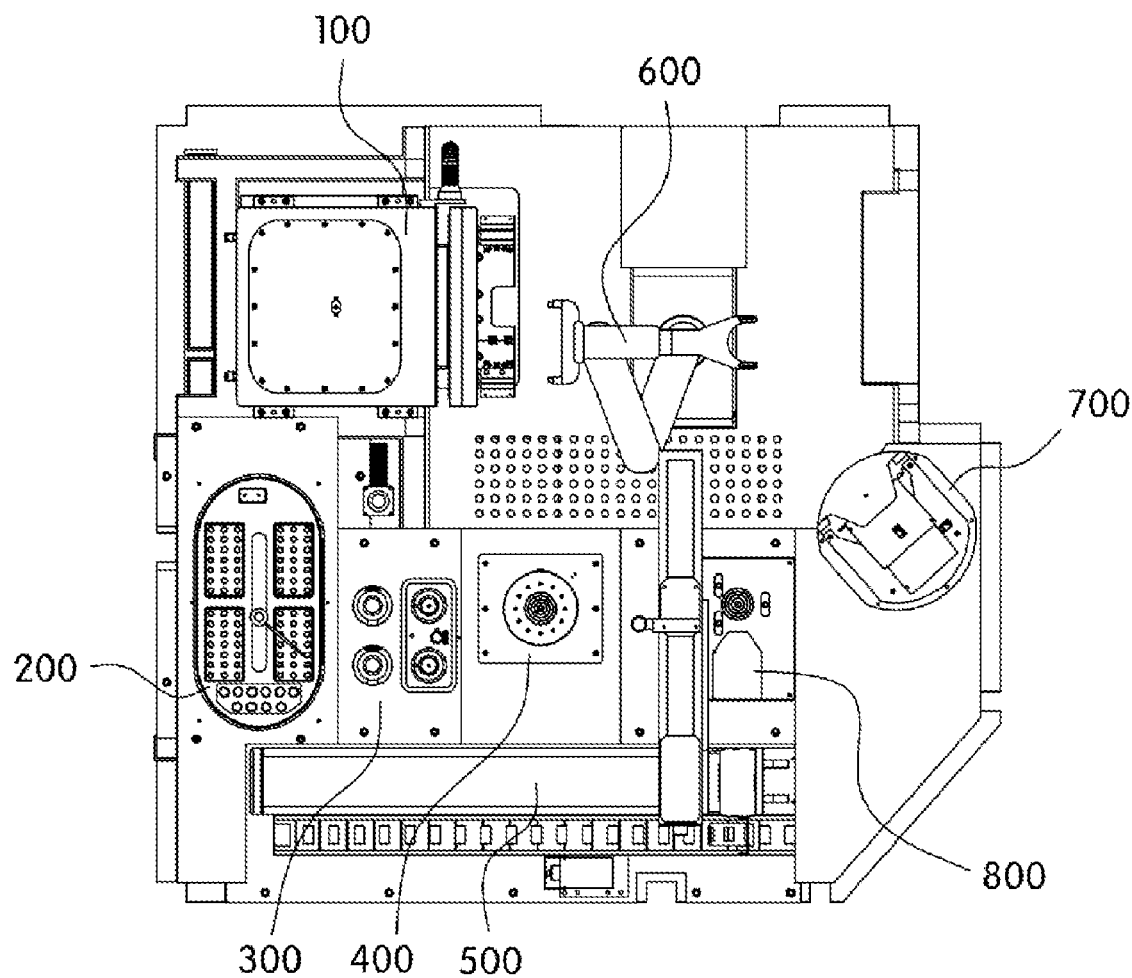
FIG. 2B is a schematic plan view showing the inside of the semiconductor wafer pollutant measurement apparatus of FIG. 2A.

FIG. 2A is a perspective view showing the whole external appearance of a semiconductor wafer pollutant measurement apparatus according to the present invention, and FIG. 2B is a schematic plan view showing the inside of the semiconductor wafer pollutant measurement apparatus of FIG. 2A.

As shown in FIGS. 2A and 2B, a semiconductor wafer pollutant measurement apparatus according to the present invention, includes: an opener 700 which is located at an entrance portion in a space which is isolated from the outside portion, and opens a wafer cassette according to size of a wafer such as 300 mm, 200 mm, and 150 mm, for example; a robot arm 600 that picks up a wafer in a cassette that is safely loaded into the opener 700 and transfers the picked wafer; a vapor phase decomposition (VPD) device 100 which primarily decomposes an oxide film formed on the surface of the wafer that is transferred by the robot arm 600; a scan stage 400 which supports the wafer whose oxide film has been decomposed and rotates the wafer at a state where the wafer has been supported; and a scanning unit 500 according to the present invention which moves along three axes of x, y and z, and inhales a reagent from a reagent solution inhalation and washing unit 300 and then moves to the scan stage 400 to thus perform a scanning operation on the wafer put on the scan stage 400, in order to make the wafer put on the scan stage 400 contact a solution, and to thereafter discharge the scanned solution into a bottle of an analyser unit 200. After having discharged, the inhalation and discharge nozzle of the scanning unit 500 is washed in the reagent solution inhalation and washing unit 300 to then inhale the reagent from the reagent solution inhalation and washing unit 300 and to repeat a scanning operation.

Description of scanning will be omitted. Here, if the scanning unit 500 reaches a predetermined position of a wafer at a state where a predetermined amount of solution is inhaled into the nozzle, it rotates the wafer and discharges part of the solution to contact the surface of the wafer. In this case, if the scanning unit 500 moves along most surfaces of the wafer in a straight line, and simultaneously makes the wafer rotate, it makes most surfaces of the wafer contact the solution so that pollutants can be collected. The solution containing the collected pollutants is transferred to the analyzer unit 200 at a state where the nozzle is in an inhalation position to then be discharged into an empty bottle of the analyzer unit 200.

Thereafter, the transfer unit robot arm 600 transfers the wafers whose tests are finished to an aligner unit 800, to thereby make the aligner unit 800 recognize identification (ID) of each wafer and align the wafers, to then remove the aligned wafers into a cassette.

If the solution having included the pollutants is discharged to the bottle of the analyzer unit 200, the whole operation of this invention ends. Then, a user measures a pollution level in every bottle through a semiconductor wafer pollutant measurement apparatus.

Figure 3:
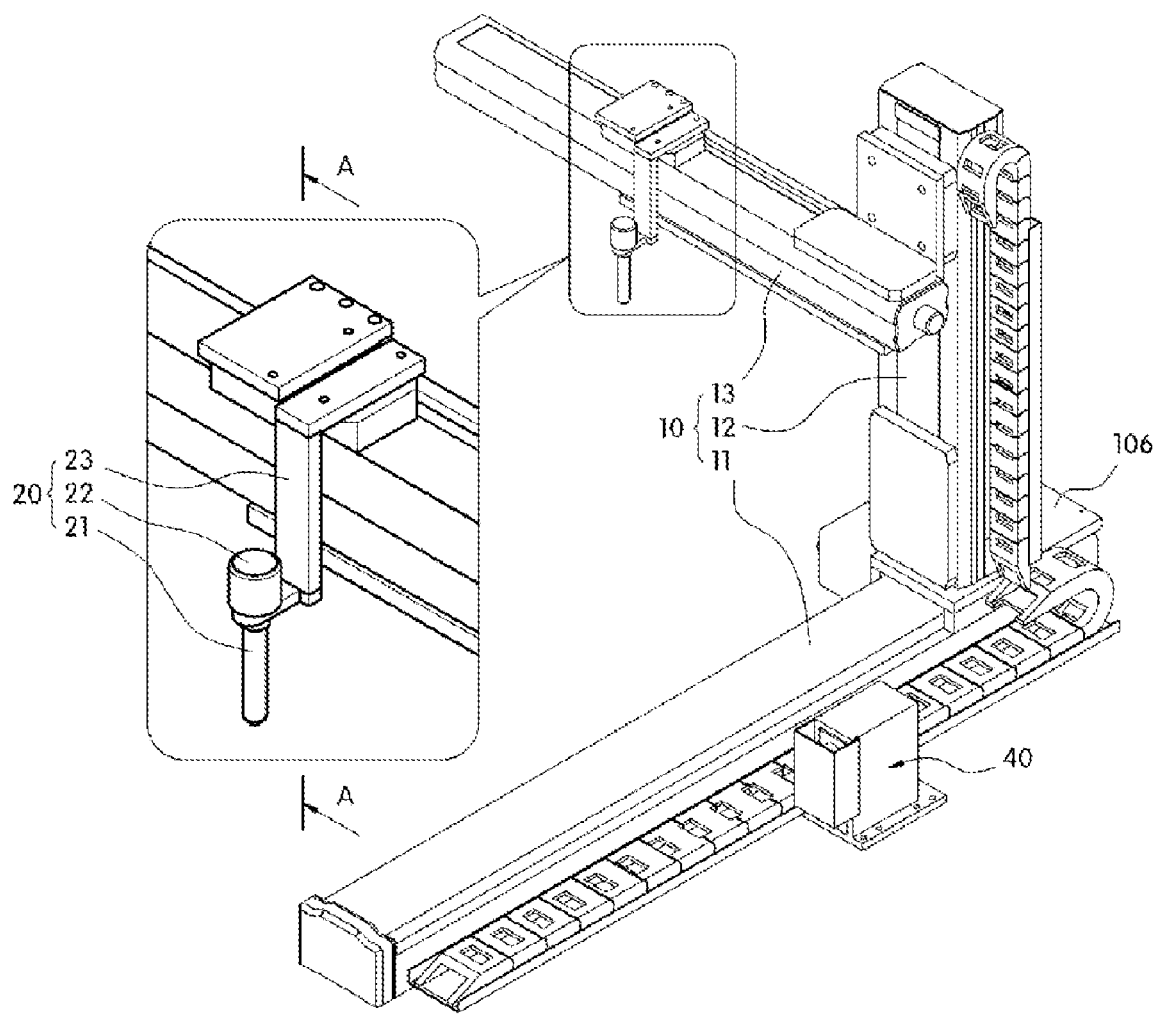
FIG. 3 is a perspective view showing a scanning device for a semiconductor wafer pollutant measurement device according to the present invention.
Figure 4:
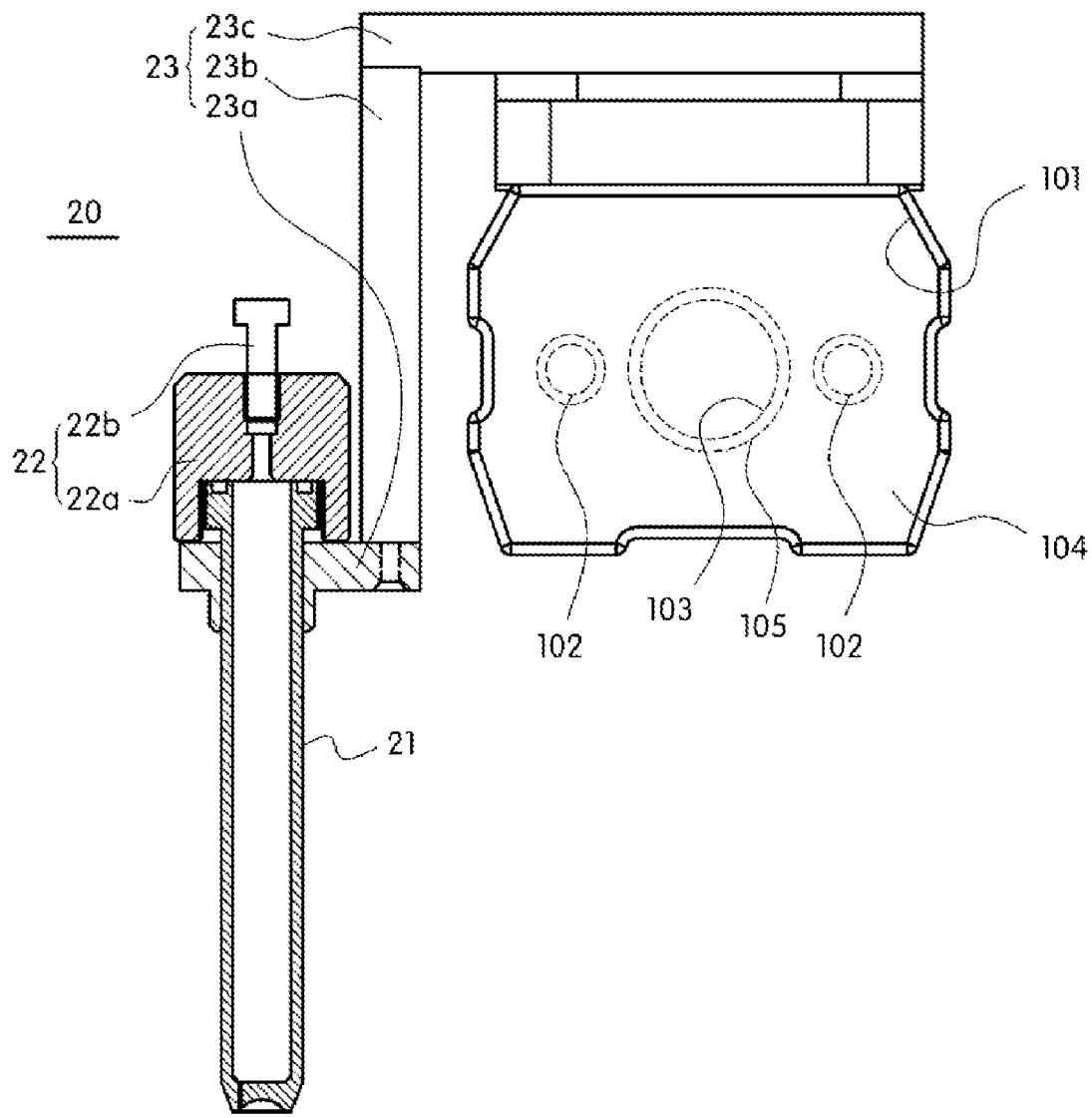
FIG. 4 is an enlarged cross-sectional view showing a nozzle portion of the scanning device for the semiconductor wafer pollutant measurement device according to the present invention.

Among the accompanying drawings, FIG. 3 is a perspective view showing a scanning device for a semiconductor wafer pollutant measurement device according to the present invention, and FIG. 4 is an enlarged cross-sectional view showing a nozzle portion of the scanning device for the semiconductor wafer pollutant measurement device according to the present invention.

As shown in FIGS. 3 and 4, a scanning device for a semiconductor wafer pollutant measurement device according to the present invention includes a scanning arm 10 and a scanning nozzle 20, a dryer 30 (FIG. 5) and a syringe pumping portion 40 largely.

Specifically, the scanning arm 10 includes: an X-axis portion 11; a Z-axis portion 12 which is perpendicularly installed with the X-axis portion 11 so as to move forward and backward with respect to the X-axis portion 11; and a Y-axis portion 13 which is perpendicularly installed with the Z-axis portion 12 so as to move up and down with respect to the Z-axis portion 12. Here, the Y-axis portion 13 is mounted on the Z-axis portion 12 and the nozzle 20 which moves forward and backward with respect to the Z-axis portion 12 is mounted on the Y-axis portion 13.

The X-axis portion 11, the Y-axis portion 13 and the Z-axis portion 12 in the scanning arm 10 includes a linear motion (LM) guide 102 and a screw bar 103 in an external casing 101, respectively, in which a slider 104 is combined with the screw bar 103 by a ball nut or bushing 105 so that the slider 104 moves according to rotation of the screw bar 103 as a drive motor 106. In addition, the scanning arm 10 includes an electric power line and other control lines. Here, the detailed description of the signal lines will be omitted.

The scanning nozzle 20 is installed at the Y-axis portion 13, and inhales a scan solution from a reagent solution bottle to then discharge a reagent scan solution on the surface of a wafer which is located on a scan stage and simultaneously keep an inhalation condition and move along the surface of the wafer, to then inhale and keep the scan solution including pollutants sticked on the wafer surface, and to thereafter move to an analyzer after inhalation to thereby discharge the scan solution. After having discharged, the inside of the nozzle is of course washed in the reagent solution bottle in order to collect pollutants of the wafer, and then a certain amount of a new reagent scan solution is inhaled to then repeat the same operation.

In particular, when the nozzle 20 performs a scanning work, the drier 30 which is closely located from the nozzle 20 performs a drying work as following the nozzle 20 in this invention. This is a very simplified and effective facility in comparison with a case where a wafer is moved to a separate drier according to the conventional art.

The nozzle 20 is placed on the Y-axis portion 13, and includes a pump connector 22, a support 23 that supports the pump connector 22 and a nozzle main body 21 that is connected at the lower portion of the pump connector 22 concretely. The pump connector 22 includes a stopper 22a for connecting a pumping hose (not shown) and a connection bracket 22b. The pumping operation for the nozzle 20 will be described with reference to FIGS. 10, 11A, and 11B.

As shown in FIG. 4, the support 23 includes: a second connector 23c which is connected with an inner slider 104 of the Y-axis portion, and moves along the inner slider 104 movably on the upper surface of the Y-axis portion 13; a first connector 23b which is perpendicularly connected with the second connector 23c; and a mount portion 23a which is horizontally extended from the first connector 23b and on which the nozzle 21 is inserted and mounted.

Therefore, a third position is determined according to movement of the Y-axis portion 13 as will be described later. Thereafter, the surface of the wafer is scanned and the reagent solution is inhaled and discharged under the control of a controller (not shown) which is separately installed at the nozzle 20. That is, the nozzle 20 scans on the wafer surface and inhales and discharges the reagent solution according to control signals output from the controller (not shown).

Figure 5:
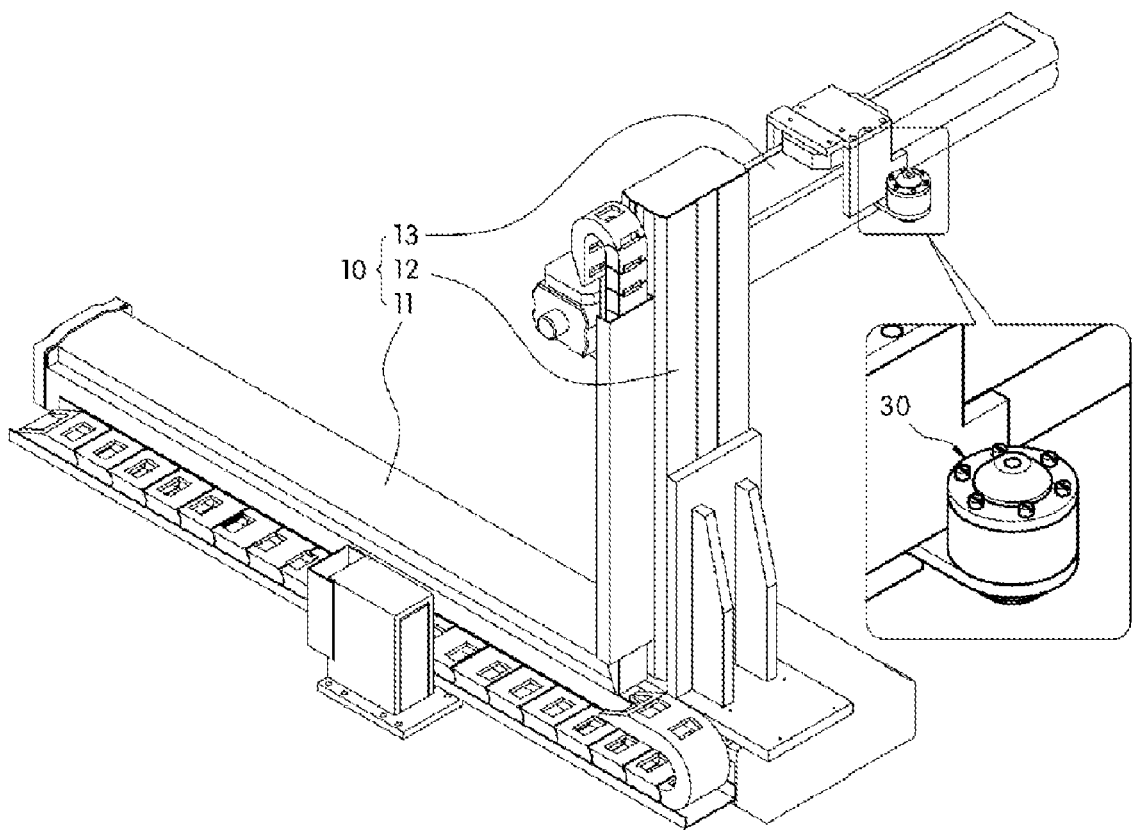
FIG. 5 is a perspective view showing the position of the nozzle of the scanning device for the semiconductor wafer pollutant measurement device according to the present invention.

FIG. 5 is a perspective view showing the position of the nozzle of the scanning device for the semiconductor wafer pollutant measurement device according to the present invention.

As shown in FIG. 5 in addition to FIG. 4, if the X-axis portion 11 is driven by a predetermined control signal, the scanning device 10 determines its position as the LM guide 102 and the slider 104 that is screw-connected with the screw bar (or a ball screw) 103 in the casing 101 move along the screw bar 103. These positional movements of the X-axis portion 11, the Y-axis portion 13 and the Z-axis portion 12 are achieved by movement of the slider 104 which is screw-connected with the screw bar 103. The screw bar 103 is linked with the shaft of a drive motor and is rotatably screw-connected with the motor shaft. Accordingly, the slider 104 moves forward and backward to thus move to a desired position.

Therefore, the scanning device 10 determines a first position when the Z-axis portion 12 moves along the X-axis portion 11, and then determines height of the Y-axis portion 13 which is mounted on the Z-axis portion 12, that is, a second position. Then, the scanning device 10 determines a third position by making both the nozzle 20 and the drier 30 which are fixed on the Y-axis portion 13 move. Thereafter, the nozzle 20 is horizontally shifted when the Z-axis portion 12 is driven to thus make the wafer surface move.

Figure 6:
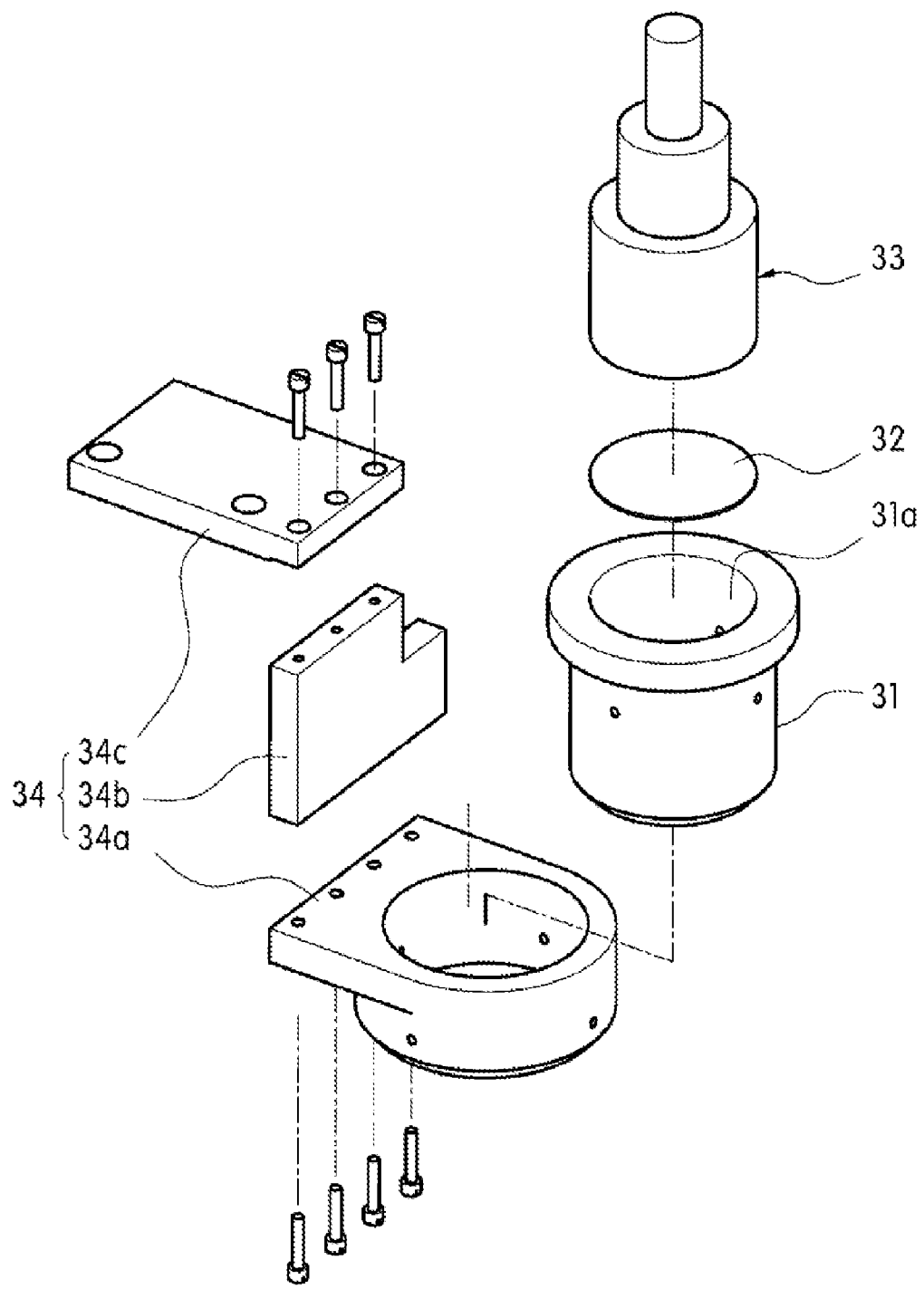
FIG. 6 is an enlarged perspective view showing essential elements of a drier of the scanning device of the semiconductor wafer pollutant measurement device according to the present invention.
Figure 7A:
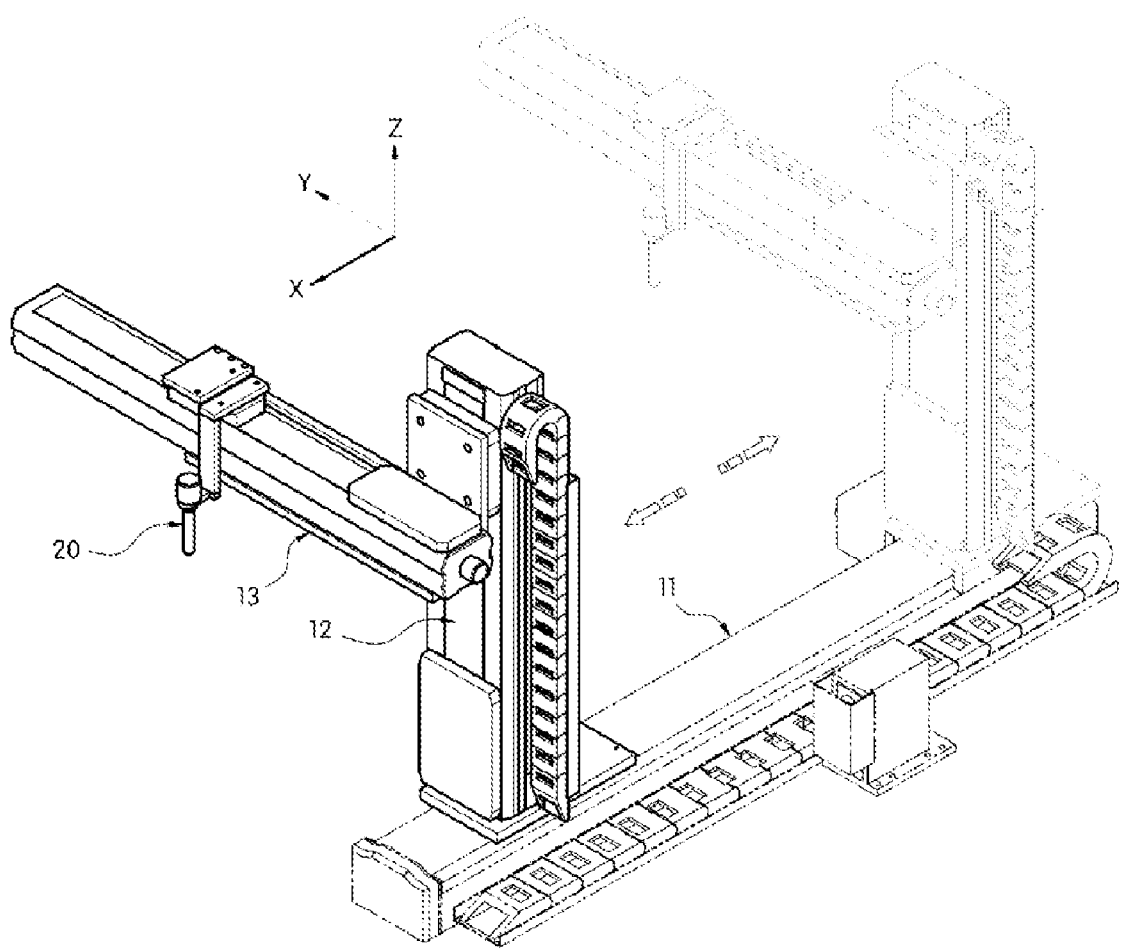
FIGS. 7A, 7B and 7C are perspective views showing operations according to positions of the nozzle of the scanning device for the semiconductor wafer pollutant measurement device according to the present invention, respectively.
Figure 7B:
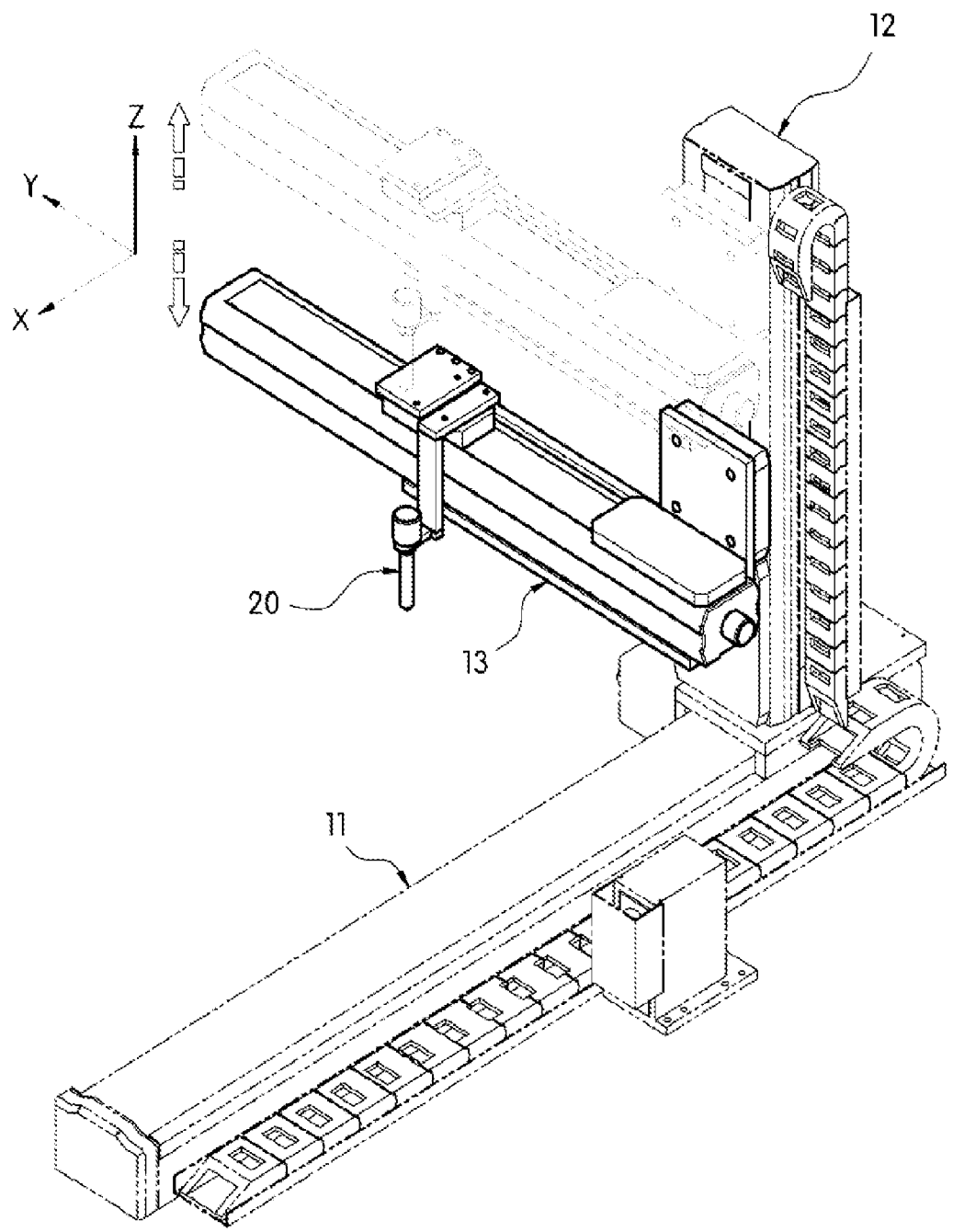
Figure 7C:
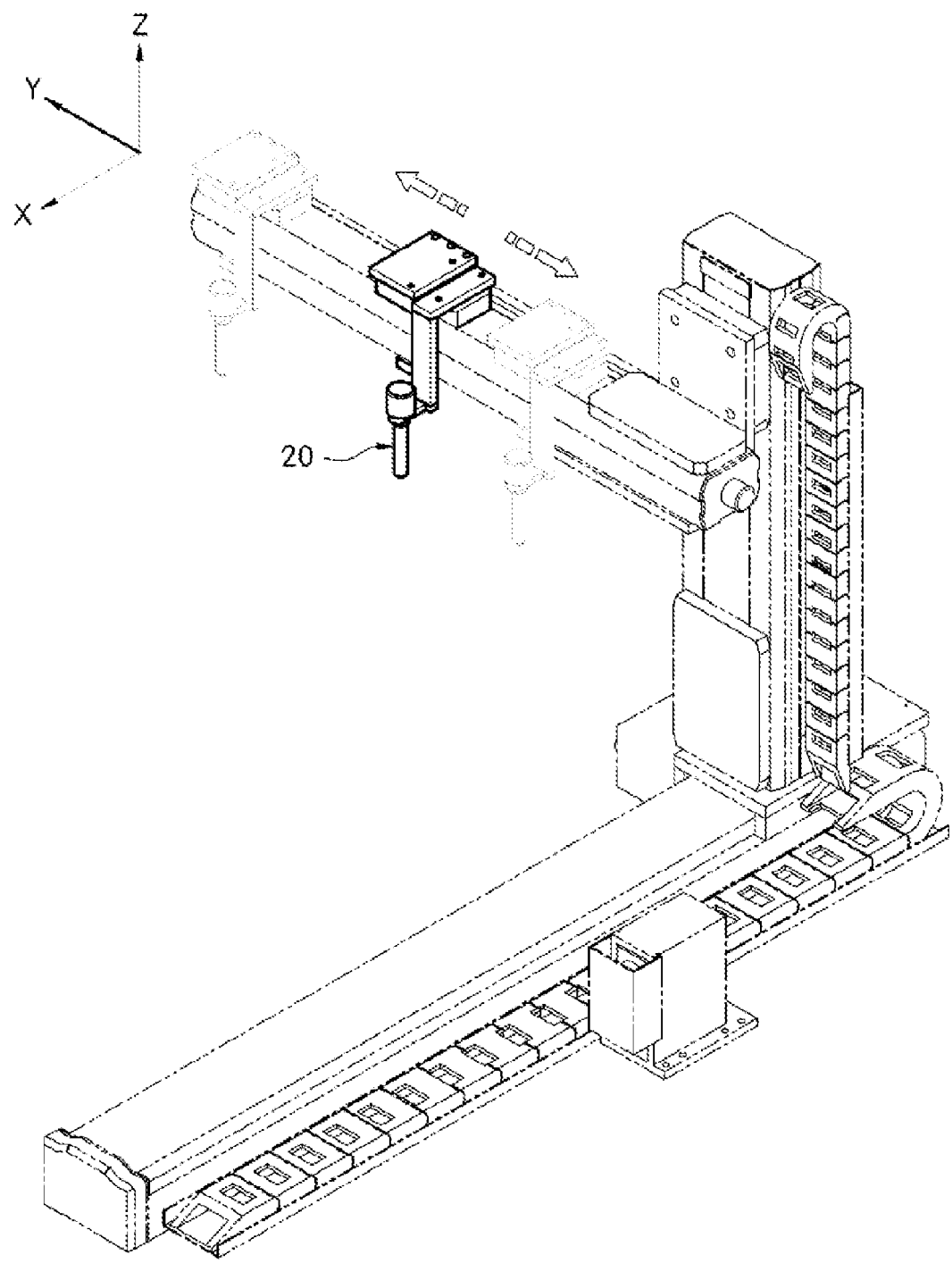
Figure 8:
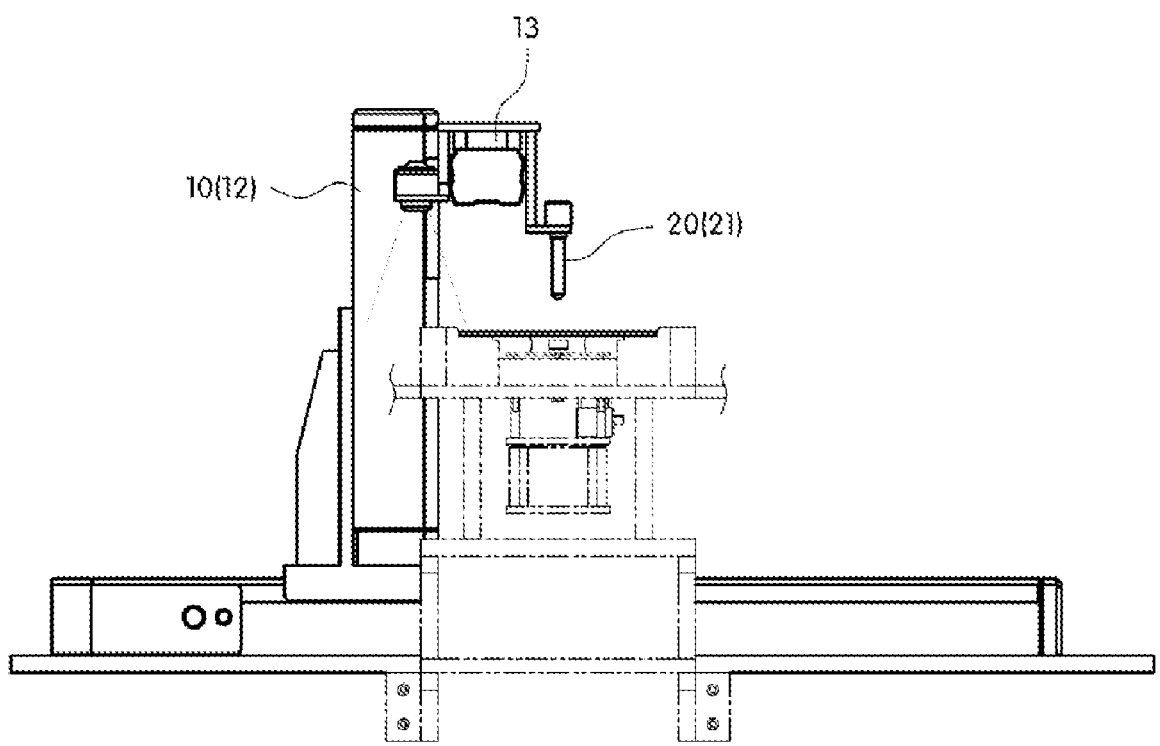
FIG. 8 is a schematic diagram showing that a nozzle and a drier simultaneously operate in the scanning device for the semiconductor wafer pollutant measurement device according to the present invention.

FIG. 6 is an enlarged perspective view showing essential elements of a drier of the scanning device of the semiconductor wafer pollutant measurement device according to the present invention. FIG. 6 is an exploded perspective view showing essential elements of a drier of the scanning device for the semiconductor wafer pollutant measurement device according to the present invention. FIG. 8 is a schematic diagram showing that a nozzle and a drier simultaneously operate in the scanning device for the semiconductor wafer pollutant measurement device according to the present invention.

The scanning device 10 for the semiconductor wafer pollutant measurement device according to the present invention includes a bracket including a first connection bracket 34c that is horizontally fixed to the Y-axis portion 13, a second connection bracket 34b which is installed perpendicularly with respect to the first connection bracket 34c, and a main bracket 34a which is installed horizontally with respect to the second connection bracket 34b in which a lamp main body 33 is inserted and mounted; and a drier 30 including the lamp main body 33 having a built-in halogen lamp, a diffusion plate 32 which diffuses downstream light of the lamp main body 33, and a socket 31 which makes the lamp main body 33 and the diffusion plate 32 mounted in an inner space 31a of the socket 31. Here, the drier 30 is horizontally fixed to the Y-axis portion 13 by the first connection bracket 34c.

The lamp main body 33 contains a halogen lamp (IR-Emitter+MC-234 parabolic reflector). The diffusion plate 32 is installed below the lamp main body 33 so that light emitted from the halogen lamp is diffused. The diffusion plate 32 is formed of a sapphire material.

Therefore, the drier according to the present invention does not perform an independent wafer drying function but is attached to the Y-axis portion 13 which is located at the end of the scanning device, so that the wafer surface is dried at a predetermined distance where the wafer has been scanned by the nozzle 20 with a reagent solution.

Figure 9B:
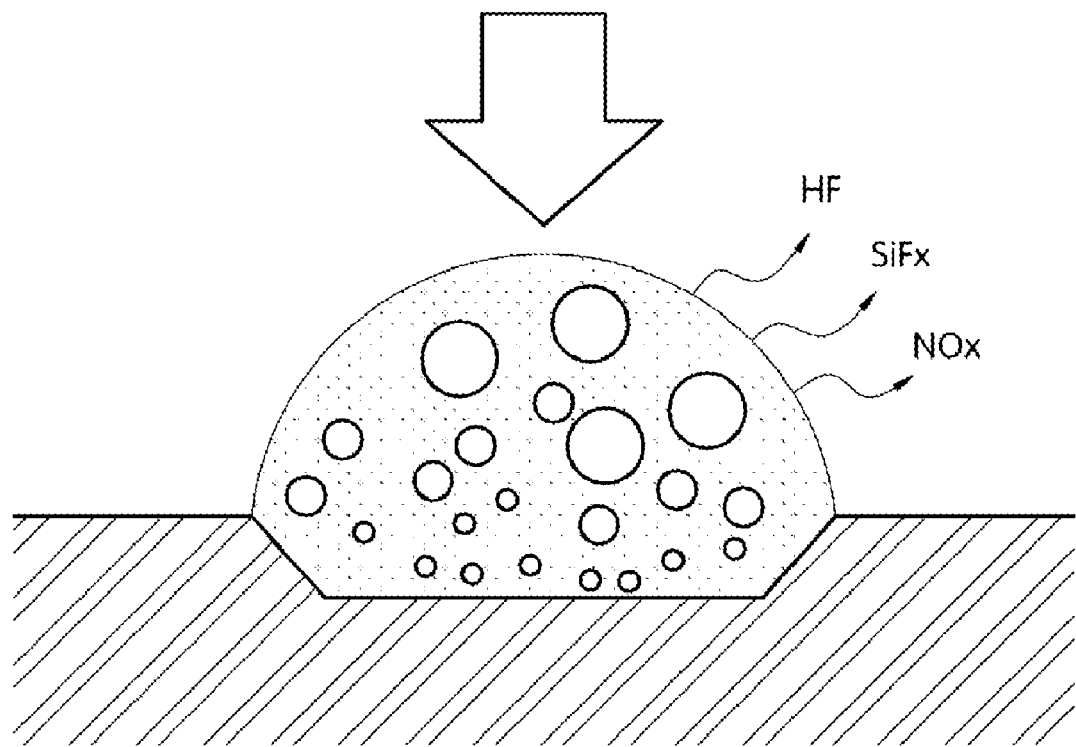
FIGS. 9A and 9B are schematic diagrams for explaining a scan operation of the scanning device for the semiconductor wafer pollutant measurement device according to the present invention, respectively.
Figure 9A:
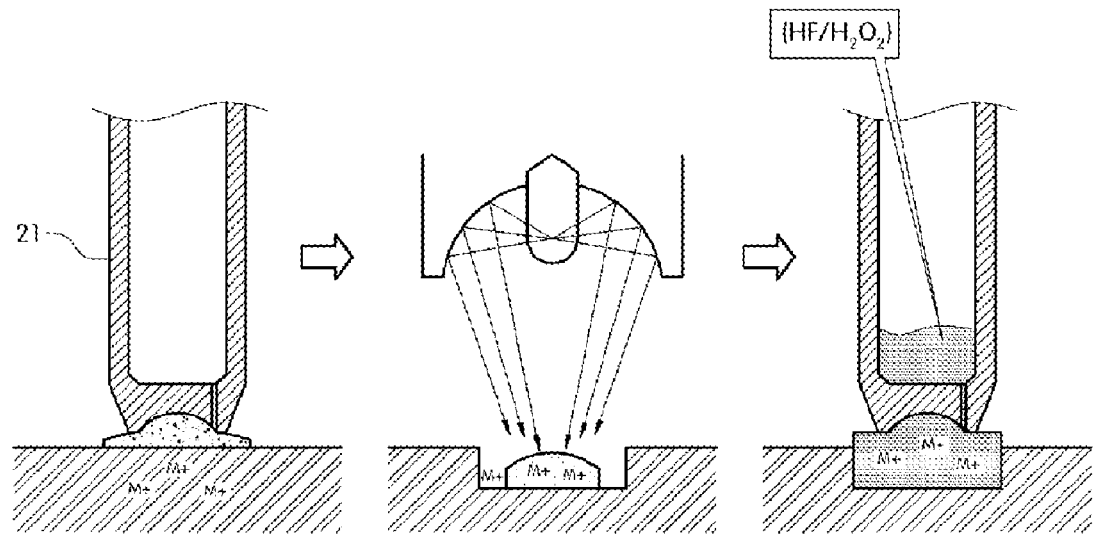

FIGS. 9A and 9B are schematic diagrams for explaining a scan operation of the scanning device for the semiconductor wafer pollutant measurement device according to the present invention, respectively.

The nozzle 20 of the scanning device 10 is installed on the Y-axis portion 13 at a state where the nozzle main body 21 contacts at a predetermined height along the oxidation processed wafer surface, and concretely includes a pump connector 22, a support 23 that supports the pump connector 22, and the nozzle main body 21 which is connected below the pump connector 22.

Thus, the scanning solution inhaled into the nozzle main body 21 is primarily discharged on the wafer surface. The scanning solution fills the oxidation processed wafer surface, and is simultaneously inhaled into the nozzle main body 21. Accordingly, as shown in FIG. 9B, the solution including the pollutants is charged into the nozzle main body 21 again.

This solution is continuously discharged and inhaled along the rotating wafer surface, to thus make it possible to collect the pollutants of the whole wafer surface. The collected pollutants are contained in bottles of an analyzer and are analyzed by the analyzer in turn.

Figure 10:
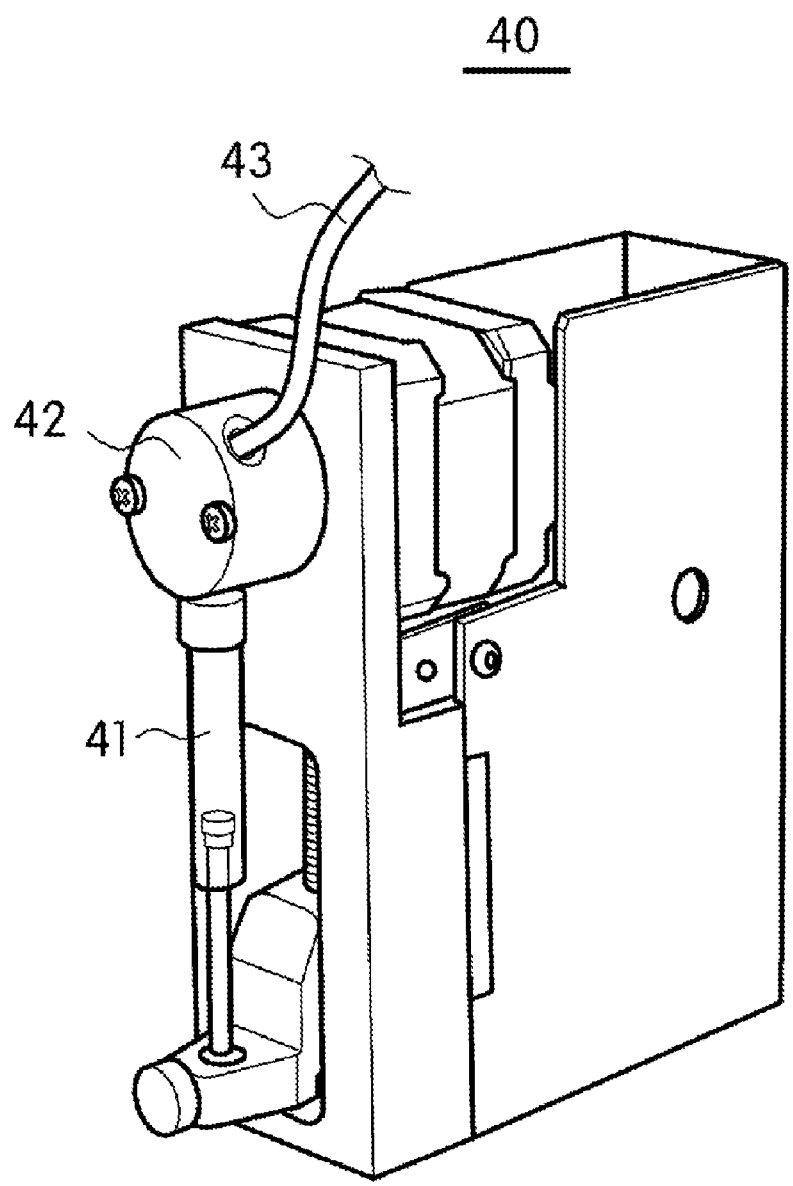
FIG. 10 is a perspective view showing a syringe pump of the scanning device for the semiconductor wafer pollutant measurement device according to the present invention.
Figure 11A:
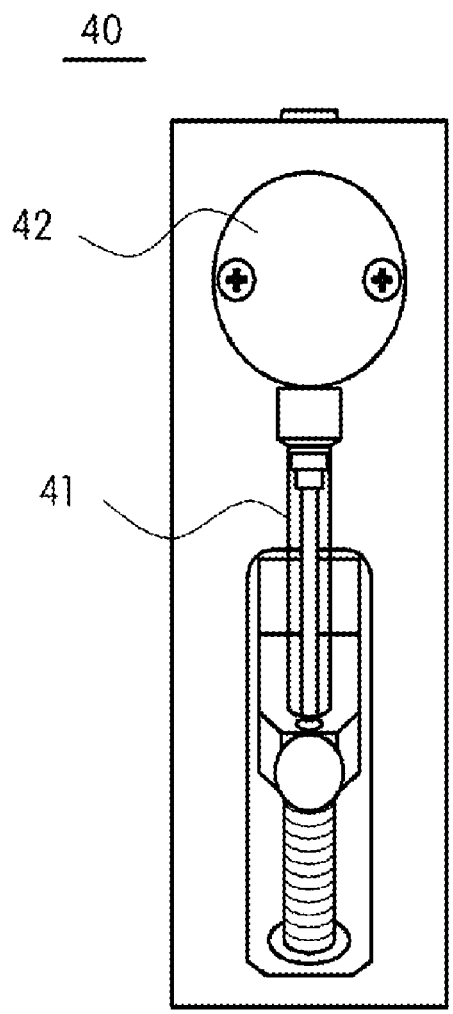
FIGS. 11A and 11B are schematic views for explaining an operation example of the scanning device for the semiconductor wafer pollutant measurement device according to the present invention.
Figure 11B:
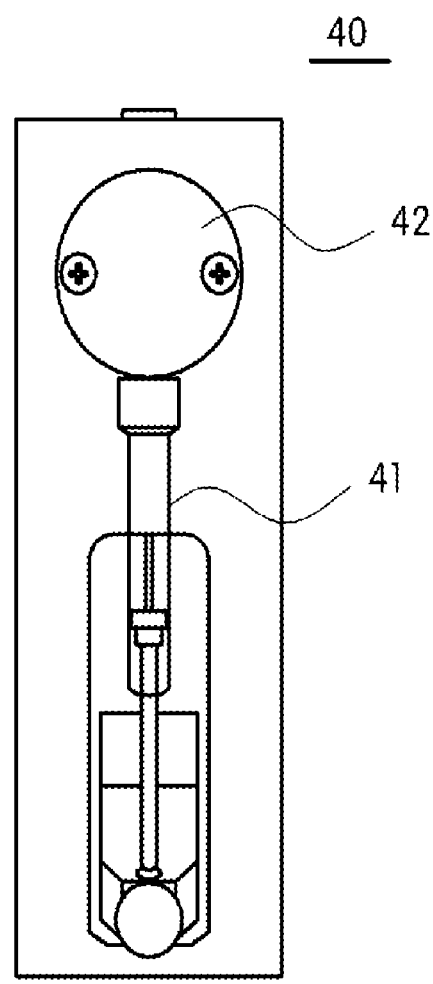

FIG. 10 is a perspective view showing a syringe pump 40 of the scanning device for the semiconductor wafer pollutant measurement device according to the present invention, and FIGS. 11A and 11B are schematic views for explaining an operation example of the scanning device for the semiconductor wafer pollutant measurement device according to the present invention.

As illustrated, the structure and operation of inhaling and pumping the reagent solution according to the present invention is accomplished by a syringe pumping portion 40. The syringe pumping portion 40 has a syringe pump body 4 whose internal load moves up and down according to ascending and descending operations in an inner cylinder of the syringe pumping portion 40 to thereby apply a pressure and inhale and discharge the reagent solution via selection of inhalation and discharge hoses 43 which are connected with an upper valve, respectively.

The present invention is not limited to the above-described embodiments. It is apparent to one who has an ordinary skill in the art that there may be many modifications and variations within the same technical spirit of the invention.

As described above, the present invention provides a scanning device which improves problems of the conventional scanning device for the semiconductor wafer pollutant measurement apparatus, that is, a complicated structural problem which is concentrated on a rotational shaft since up and down movements and left and right rotations are simultaneously performed on the rotational shaft, and a defect that a motion accuracy drops on the wafer surface which is an important variable of a scanning work since up and down movements are performed in the case that a nozzle is selected after making a rotational trace during scanning, and thus provides an effect of attaining a three-axis accurate operational trace.

Moreover, this invention provides an effect of making a user grasp a contact condition at a nozzle and in bottles by a lighting unit to thus make the user grasp up and down positional movements of a nozzle and a condition of collecting pollutants accurately.

What is claimed is:

1. A scanning device for a semiconductor wafer pollutant measurement apparatus, the scanning device comprising:
a scanning arm comprising an X-axis portion, a Z-axis portion which is perpendicularly installed with the X-axis portion so as to move forward and backward along the X-axis portion, and a Y-axis portion which is perpendicularly installed with the Z-axis portion so as to move up and down with respect to the Z-axis portion, wherein the X-axis portion, the Y-axis portion, and the Z-axis portion comprises a linear motion guide and a screw bar in an external casing, respectively, in which a slider is combined with the screw bar by a ball bushing combination so that the slider moves according to rotation of the screw bar;
a scanning nozzle including:
a nozzle main body;
a support that supports the nozzle main body, the support comprises, a second connector which is connected with an inner slider of the Y-axis portion, a first connector which is perpendicularly connected with the second connector, and a mount portion which is horizontally extended from the first connector and on which the nozzle is inserted and mounted; and
a pump connector to which a predetermined pumping power is transferred, wherein the scanning nozzle inhales a scan solution from a reagent solution bottle to then discharge a reagent scan solution on the surface of a wafer which is located on a scan stage and simultaneously keep an inhalation condition and move along the surface of the wafer, to then inhale and keep the scan solution including pollutants stuck on the wafer surface, and to thereafter move to an analyzer after inhalation to thereby discharge the scan solution;
a first connection bracket that is horizontally fixed to the Y-axis portion;
a second connection bracket which is installed perpendicularly with respect to the first connection bracket; and
a main bracket which is installed horizontally with respect to the second connection bracket; and a dryer attached to the main bracket and including the lamp main body having a built-in halogen lamp, a diffusion plate which diffuses downstream light of the lamp main body, and a socket which makes the lamp main body and the diffusion plate mounted in an inner space; and a syringe pumping portion attached to the x-axis portion, the syringe pumping portion having a syringe pump body whose load moves up and down according to ascending and descending operations in an inner cylinder to thereby apply a pressure and inhale and discharge the reagent solution via selection of inhalation and discharge hoses which are connected with an upper valve, respectively.

* * * * *